(12) United States Patent
Shimamura et al.

(10) Patent No.: US 6,316,955 B1
(45) Date of Patent: Nov. 13, 2001

(54) PHOTOELECTRIC CONVERSION INTEGRATED CIRCUIT DEVICE

(75) Inventors: Nobutoshi Shimamura; Kenzo Shodo, both of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/381,964

(22) PCT Filed: Apr. 2, 1998

(86) PCT No.: PCT/JP98/01550

§ 371 Date: Feb. 15, 2000

§ 102(e) Date: Feb. 15, 2000

(87) PCT Pub. No.: WO98/44563

PCT Pub. Date: Oct. 8, 1998

(30) Foreign Application Priority Data

Apr. 3, 1997 (JP) .................................................... 9-084761

(51) Int. Cl.[7] ........................... H01L 31/068; G01R 31/27
(52) U.S. Cl. ................................................ 324/767; 257/461
(58) Field of Search ........................ 257/461; 324/537, 324/767

(56) References Cited

U.S. PATENT DOCUMENTS

| | | | |
|---|---|---|---|
| 4,241,358 | * 12/1980 | Wade | 257/461 |
| 5,418,396 | * 5/1995 | Mita | 257/461 |
| 5,585,731 | * 12/1996 | Tsuchida et al. | 324/537 |
| 5,767,538 | * 6/1998 | Mullins et al. | 257/461 |

FOREIGN PATENT DOCUMENTS 63-13368    1/1988  (JP) .

* cited by examiner

*Primary Examiner*—Gene M. Munson
(74) *Attorney, Agent, or Firm*—Arent Fox Kintner Plotkin & Kahn, PLLC

(57) ABSTRACT

A photoelectric conversion integrated circuit device for converting a light signal into a voltage signal has a photodiode that outputs a current in accordance with a light signal it receives, a current-to-voltage conversion circuit that outputs a voltage signal in accordance with a current signal it receives, and a test circuit that outputs a current and whose on/off state is controllable from the outside. At the output of the photodiode, two output terminals are provided, of which one is connected to the current-to-voltage conversion circuit and the other to the test circuit. This photoelectric conversion integrated circuit device allows a fault in the wiring between the photodiode and the current-to-voltage conversion circuit to be detected by feeding an input current to the current-to-voltage conversion circuit without shining light on the photodiode.

3 Claims, 2 Drawing Sheets

PHOTOELECTRIC CONVERSION INTEGRATED CIRCUIT DEVICE

TECHNICAL FIELD

The present invention relates to a photoelectric conversion integrated circuit device provided with a light-sensing device that outputs a current signal in accordance with a light signal it receives and a current-to-voltage conversion circuit that outputs a voltage signal in accordance with a current signal it receives so as to convert, as a whole, a light signal into a voltage signal.

BACKGROUND ART

FIG. 4 shows a circuit block diagram of a conventional photoelectric conversion integrated circuit device that employs a photodiode as a light-sensing device. In this figure, reference numeral 1' represents a photodiode that outputs a current signal in accordance with a light signal it receives, reference numeral 2 represents a current-to-voltage conversion circuit (hereafter referred to as the "I/V conversion circuit") that outputs a voltage in accordance with a current signal it receives, and reference numeral 3 represents a test circuit composed of a switching device 31, a constant-current circuit 32, and a switch driving circuit 33.

To the input of the I/V conversion circuit 2, the output (cathode) of the photodiode 1' is connected, and the constant-current circuit 32 provided within the test circuit 3 is also connected thereto through the switching device 31. Thus, when the photodiode 1' senses a light signal L, or when the switching device 31 is turned on, a current flows from the I/V conversion circuit 2 to the photodiode 1' or to the switching device 31, and a voltage corresponding to this current is fed out via a terminal $T_o$. Within the I/V conversion circuit 2, as shown in FIG. 5, a reference voltage Vref is applied to the non-inverting input terminal (+) of an operational amplifier via a terminal 21 through a resistor R1, and the cathode of the photodiode 1' is connected via a terminal 22 to the inverting input terminal (−) the operational amplifier. Between this inverting input terminal (−) and the output terminal $T_o$, a resistor R2 is connected. When an output current flows through the photodiode 1', the current I flows through the resistor R2, and thus a voltage I×R2 appears at the output terminal $T_o$.

In FIG. 4, the switch driving circuit 33 controls the on/off state of the switching device 31; specifically, when the switch driving circuit 33 receives a predetermined voltage at its test pin $T_T$, it turns on the switching device 31.

In general, an integrated circuit device is subjected to a functioning check in its manufacturing process. In a functioning check of a photoelectric conversion integrated circuit device, it is desirable to shine light on the photodiode (light-sensing device) 1'; however, in reality, it is difficult to shine a predetermined amount of light on the photodiode 1'. For this reason, a functioning check is achieved by externally turning on the switching device 31 provided within the test circuit 3 so that the constant-current circuit 32 will cause the I/V conversion circuit 2 to output a predetermined amount of current as much as it outputs when a predetermined amount of light is shone on the photodiode 1'.

Here, if there is a break at point A' shown in FIG. 4 in the wiring between the photodiode 1' and the I/V conversion circuit 2, even if the photodiode 1' senses light, the I/V conversion circuit 2 outputs no current I; that is, the photoelectric conversion integrated circuit device is defective.

However, in the functioning check described above, unless there is a fault in the wiring between the I/V conversion circuit 2 and the test circuit 3, the I/V conversion circuit 2 outputs a current, and therefore, unless any fault is found in other respects such as the characteristics of the I/V conversion circuit 2, the photoelectric conversion integrated circuit device passes as acceptable.

In this way, with a conventional photoelectric conversion integrated circuit device, even if a functioning check is conducted in the manner described above, i.e. by feeding an input current to the I/V conversion circuit without shining light on the light-sensing device, it is impossible to detect a fault in the wiring between the photodiode 1' and the I/V conversion circuit 2.

Disclosure of the Invention

An object of the present invention is to provide a photoelectric conversion integrated circuit device that allows detection of a fault in the wiring between a light-sensing device and an I/V conversion circuit even if an input current is fed to the I/V conversion circuit without shining light on the light-sensing device.

To achieve the above object, according to one aspect of the present invention, a photoelectric conversion integrated circuit device for converting a light signal into a voltage signal is provided with a light-sensing device that outputs a current in accordance with a light signal it receives, a current-to-voltage conversion circuit that outputs a voltage signal in accordance with a current signal it receives, and a test circuit that outputs a current in accordance with a drive signal fed from outside. In addition, a plurality of terminals are provided at the output of the light-sensing device, with one of the terminals connected to the current-to-voltage conversion circuit and at least one of the remainder of the terminals connected to the test circuit.

According to this configuration, the current exchanged between the I/V conversion circuit (current-to-voltage conversion circuit) and the test circuit always flows by way of the wiring between the light-sensing device and the I/V conversion circuit and by way of the output layer of the light-sensing device. If there is a fault such as a break in the wiring between the light-sensing device and the I/V conversion circuit, no input current can be fed to the I/V conversion circuit by the test circuit.

According to another aspect of the present invention, in the photoelectric conversion integrated circuit device described above, the temperature characteristic of the conversion efficiency of the current-to-voltage conversion circuit is reverse to the temperature characteristic of the output of the test circuit.

In general, even if the input current fed to the I/V conversion circuit is kept constant, its output varies with temperature. However, according to this configuration, the input current fed to the I/V conversion circuit by the test circuit varies in such a way as to cancel the variation of the output of the I/V conversion circuit. This makes it possible to keep the output free from influence of temperature variation and thus keep it substantially at a fixed level. Accordingly, it is possible to conduct a functioning check of the photoelectric conversion integrated circuit device with higher accuracy.

According to still another aspect of the present invention, in a photoelectric conversion integrated circuit device, a photodiode is composed of a semiconductor substrate and first and second terminals that are kept in contact with a first conducting layer formed within the substrate so as to exhibit conduction reverse to that of the substrate. In addition, a photodiode current flows from the first terminal to a second conducting layer, then to the first conducting layer, and then to the substrate, and a test current flows from the first terminal to the second conducting layer, and then to the second terminal.

BEST MODE FOR CARRYING OUT THE INVENTION

Figure 1:
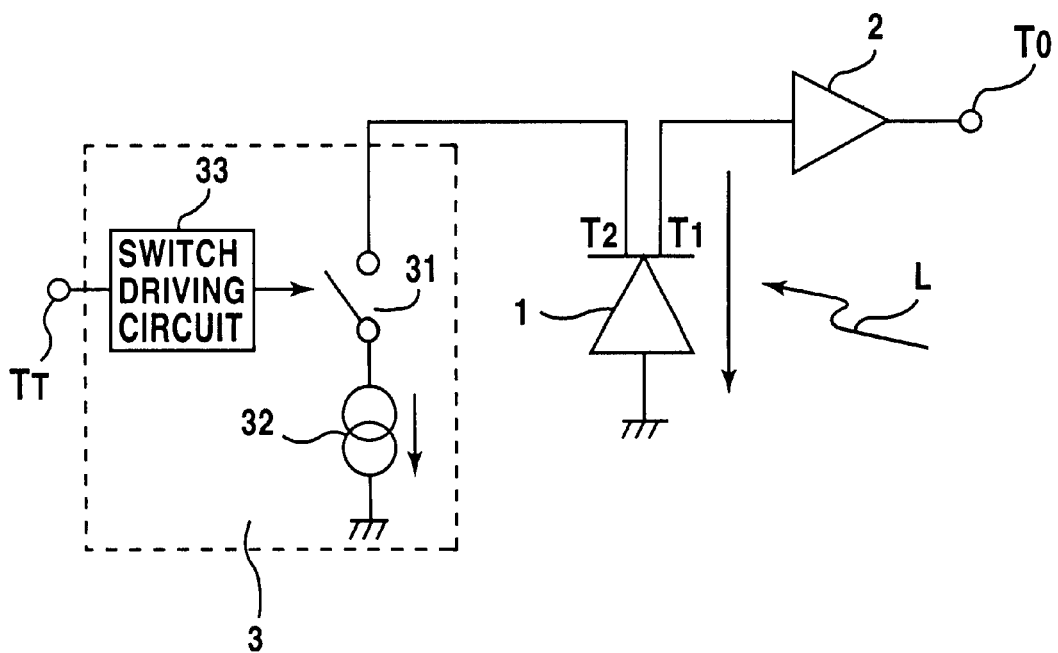
FIG. 1 is a circuit block diagram of an example of a photoelectric conversion integrated circuit device embodying the present invention.

Hereinafter, embodiments of the present invention will be described with reference to the drawings. FIG. 1 shows a circuit block diagram of an example of a photoelectric conversion integrated circuit device embodying the present invention. In this figure, reference numeral 1 represents a photodiode, which has two terminals $T_1$ and $T_2$ at its cathode (output), and which outputs a current signal in accordance with a light signal it receives. The photodiode 1 has its output terminal $T_1$ connected to an I/V conversion circuit 2, and has its output terminal $T_2$ connected to a test circuit 3. Note that such elements as are found also in the conventional example described previously are identified with the same reference numerals and symbols, and overlapping descriptions will not be repeated.

Figure 2:
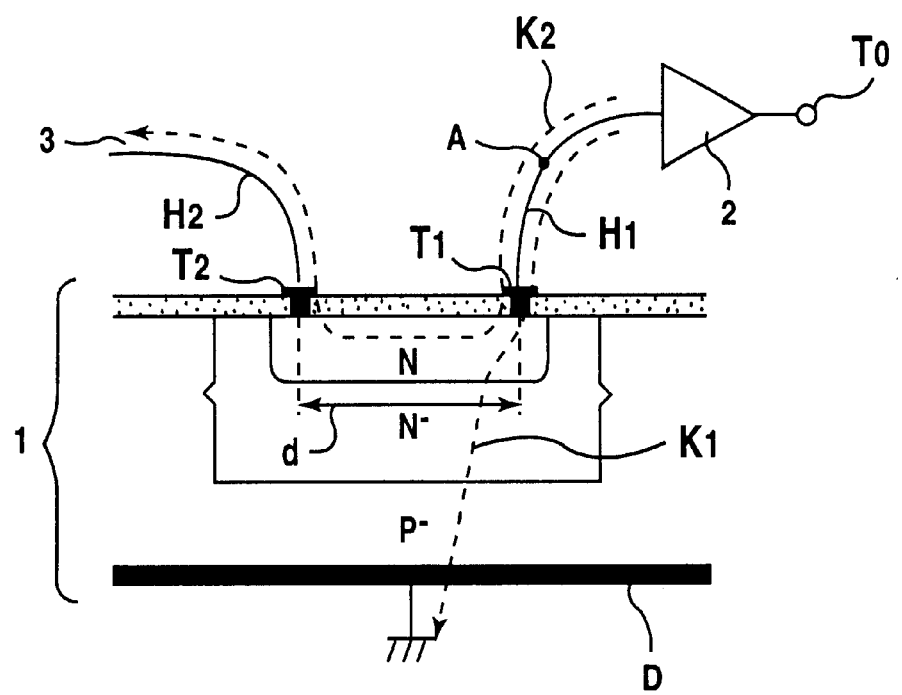
FIG. 2 is a diagram showing a section of the chip of the photodiode 1 shown in FIG. 1.

FIG. 2 shows a section of the chip of the photodiode 1. As shown in this figure, the photodiode 1 has a substrate $P^-$ (high-resistance P-type semiconductor) and an epitaxial layer $N^-$ (high-resistance N-type semiconductor). The substrate $P^-$ is used as an anode, and a low-resistance region N within the epitaxial layer $N^-$ used as a cathode. The two terminals $T_1$ and $T_2$ are kept in contact with the region N. The substrate $P^-$ is connected to ground via an electrode D.

In this photoelectric conversion integrated circuit device configured as described above, when the photodiode 1 senses light, a current flows by way of the path indicated by $K_1$ in FIG. 2. On the other hand, when the switching device 31 provided within the test circuit 3 is turned on from the outside, a current flows by way of the path indicated by $K_2$ in FIG. 2. In either case, the current originates from the I/V conversion circuit 2.

In this way, in the photoelectric conversion integrated circuit device of this embodiment, even when an input current is fed to the I/V conversion circuit 2 by the test circuit 3, the current always flows by way of the wiring $H_1$ connecting the photodiode 1 to the I/V conversion circuit 2 and by way of the output layer (cathode N) of the photodiode 1.

Thus, if there is a break at point A shown in FIG. 2 in the wiring $H_1$ connecting the photodiode 1 to the I/V conversion circuit 2, even if the switching device 31 provided within the test circuit 3 is turned on from the outside, it is impossible to extract a current from the I/V conversion circuit 2. That is, even when an input current is fed to the I/V conversion circuit 2 without shining light on the photodiode 1, it is possible to detect a fault in the wiring between the photodiode 1 and the I/V conversion circuit 2 without fail.

Here, it is preferable to arrange the wiring $H_1$ connecting the photodiode 1 to the I/V conversion circuit 2 and the wiring $H_2$ connecting the photodiode 1 to the test circuit 3 as far away as possible from each other. The reason is that, if the two wirings are arranged too close to each other, there is a strong possibility of a current flowing between the I/V conversion circuit 2 and the test circuit 3 without flowing by way of the wiring $H_1$ connecting the photodiode 1 to the I/V conversion circuit 2 and by way of the output layer (cathode N) of the photodiode 1.

For the same reason, it is preferable to arrange the two terminals $T_1$ and $T_2$, provided on the output layer of the photodiode 1, with as long a distance (indicated by d in FIG. 2) as possible secured between them.

In general, even if the current fed to the I/V conversion circuit 2 is kept constant, its output varies with temperature. Therefore, it is preferable to make he temperature characteristics of the I/V conversion circuit 2 reverse to the temperature characteristics of the test circuit 3 so that, as temperature rises, the output of the I/V conversion circuit 2 will increase and the output of the test circuit 3 (constant-current circuit 32) will decreases. This allows the current flowing between the test circuit 3 and the I/V conversion circuit 2 to vary in such a way as to cancel the variation of the output of the I/V conversion circuit 2. This makes it possible to keep the output free from influence of temperature variation and thus keep it substantially at a fixed level. Accordingly, it is possible to conduct a functioning check of the photoelectric conversion integrated circuit device with more accuracy.

Figure 3:
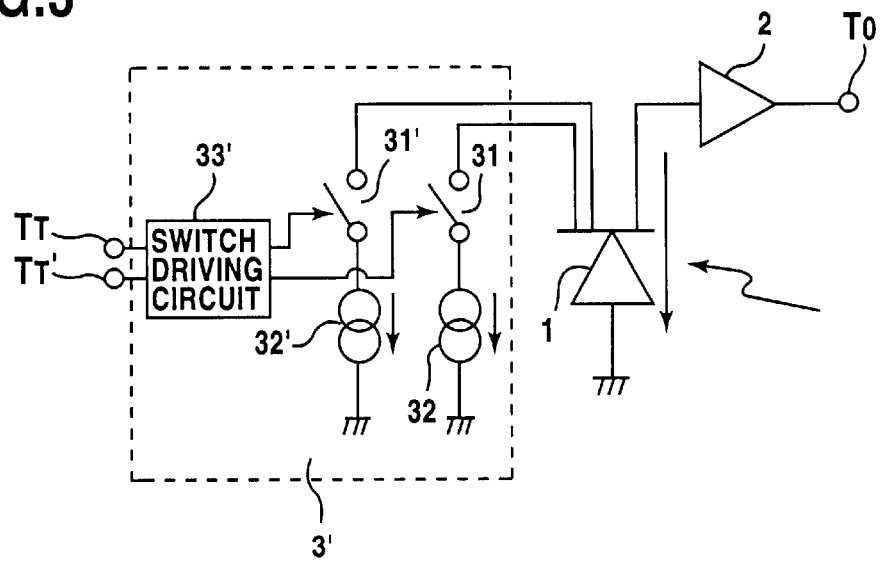
FIG. 3 is a circuit block diagram of another example of a photoelectric conversion integrated circuit device embodying the present invention.
Figure 4:
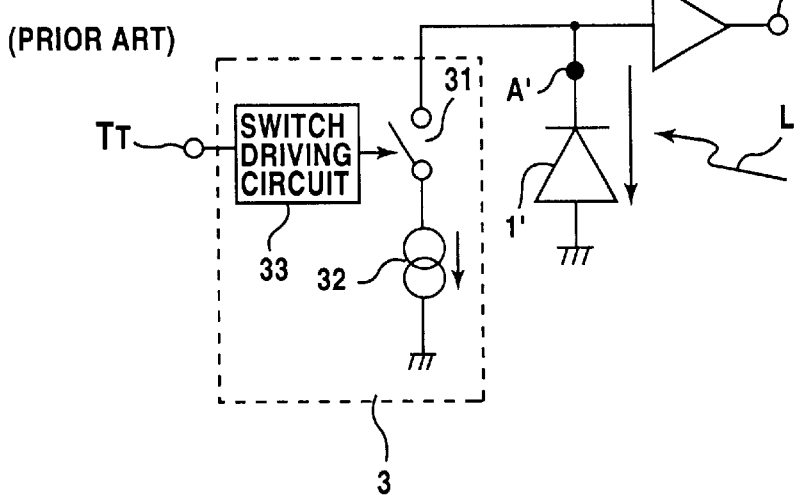
FIG. 4 is a circuit block diagram of a conventional photoelectric conversion integrated circuit device.
Figure 5:
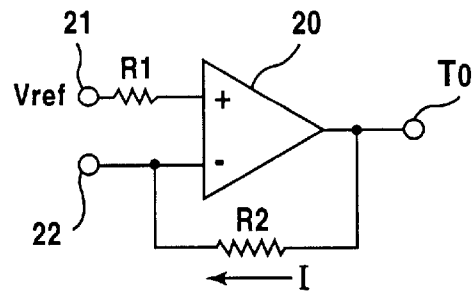
FIG. 5 is a circuit diagram showing a practical configuration of the I/V conversion circuit employed in the conventional photoelectric conversion integrated circuit device shown in FIG. 4.

In the embodiment described above, two terminals are provided at the output of the light-sensing device (photodiode 1). However, the light-sensing device may be provided with three or more output terminals. For example, as shown in FIG. 3, in a case where the light-sensing device is provided with three output terminals, one of those three terminals is connected to the I/V conversion circuit 2, and the other two are individually connected, through two separate switching devices 31 and 31' that are controlled by a switch driving circuit 33', to two separate constant-current circuits 32 and 32' that output different amounts of current. This allows one of three types of input current to the I/V conversion circuit 2, and thus makes it possible to conduct a versatile functioning check.

Industrial Applicability

As described above, according to the present invention, in a photoelectric conversion integrated circuit device, it is possible to detect a fault in the wiring connecting a light-sensing device to an I/V conversion circuit by feeding a current to the I/V conversion circuit without shining light on the light-sensing device. This helps enhance the reliability of the photoelectric conversion integrated circuit device. Accordingly, such a photoelectric conversion integrated circuit device is suitable for use in a pickup device for a compact disc player, digital video disc player, magneto-optical disc player, or the like.

What is claimed is:

1. A photoelectric conversion integrated circuit device for converting a light signal into a voltage signal, said photoelectric conversion integrated circuit device having a light-sensing device that outputs a current in accordance with a light signal it receives, a current-to-voltage conversion circuit that outputs a voltage signal in accordance with a current signal it receives, and a test circuit that outputs a current in accordance with a drive signal fed from outside, wherein said light-sensing device comprises:
a first conductive region connected to a fixed voltage;
a second conductive region of an opposite conductivity type to the first conductive region;
an output terminal provided at a predetermined point on the second conductive region and connected to said current-to-voltage conversion circuit; and
a plurality of output terminals provided at a plurality of points, different from said point, on the second conductive region,
wherein said test circuit has a plurality of circuits each including a switch and a constant-current source connected to said switch and a switch drive circuit for driving the switches, said plurality of circuits being connected individually to said plurality of output terminals of said light-sensing device.

2. A photoelectric conversion integrated circuit device for converting a light signal into a voltage signal, said photoelectric conversion integrated circuit device having a light-sensing device that outputs a current in accordance with a light signal it receives, a current-to-voltage conversion circuit that outputs a voltage signal in accordance with a current signal it receives, and a test circuit that outputs a current in accordance with a drive signal fed from outside, wherein a plurality of terminals are provide at an output of said light-sensing device, one of said terminals being connected to said current-to-voltage conversion circuit and at least one of the remainder of said terminals being connected to said test circuit, and wherein a wiring connecting an output terminal of said light-sensing device to said current-to-voltage conversion circuit and a wiring connecting the output terminal of said light-sensing device to said test circuit are arranged as far away as possible from each other so as to prevent a direct flow of current between those two wirings.

3. A photoelectric conversion integrated circuit device for converting a light signal into a voltage signal, said photoelectric conversion integrated circuit device having a light-sensing device that outputs a current in accordance with a light signal it receives, a current-to-voltage conversion circuit that outputs a voltage signal in accordance with a current signal it receives, and a test circuit that outputs a current in accordance with a drive signal fed from outside, wherein a plurality of terminals are provide at an output of said light-sensing device, one of said terminals being connected to said current-to-voltage conversion circuit and at least one of the remainder of said terminals being connected to said test circuit, and wherein, among said plurality of terminals provided at the output of said light-sensing device, the terminal connected to an input side of said current-to-voltage conversion circuit and the terminal connected to said test circuit are arranged as far away as possible from each other so as to prevent a direct flow of current between those two terminals.

* * * * *